United States Patent [19]

Kingsbury

[11] 3,781,584

[45] Dec. 25, 1973

[54] SOLID STATE ALPHANUMERIC INDICATOR AND LEAD FRAME

[75] Inventor: Richard F. Kingsbury, San Jose, Calif.

[73] Assignee: Litronix, Inc., Cupertino, Calif.

[22] Filed: Mar. 13, 1972

[21] Appl. No.: 234,187

[52] U.S. Cl. ........... 313/109.5, 174/52 PE, 313/108

[51] Int. Cl. ...................... H05b 33/06, H05b 33/14

[58] Field of Search ..................... 313/108 D, 109.5; 174/52 PE; 29/588

[56] References Cited

UNITED STATES PATENTS

| | | | |
|---|---|---|---|
| 3,627,901 | 12/1971 | Happ | 174/52 PE |
| 3,609,475 | 9/1971 | Kaposhilin | 313/108 D X |
| 3,341,649 | 9/1967 | James | 174/52 PE |
| 3,404,319 | 10/1968 | Tsuji et al. | 174/52 S X |
| 3,531,856 | 10/1970 | Bell et al. | 29/588 X |

FOREIGN PATENTS OR APPLICATIONS

| | | | |
|---|---|---|---|
| 1,817,307 | 8/1969 | Germany | 313/108 D |

*Primary Examiner*—Palmer C. Demeo
*Attorney*—Stephen S. Townsend et al.

[57] ABSTRACT

An alphanumeric indicator device in which the alphanumeric character is visible from one face of the device and the terminal pins for effecting electrical connection to the device extend from the opposite face of the device. A method for fabricating the device so as to eliminate the necessity for bending lead frame members after final assembly of the device. An improved lead frame for forming an alphanumeric indicator wherein the final configuration of the lead frame is established at the outset of the fabrication process.

3 Claims, 6 Drawing Figures

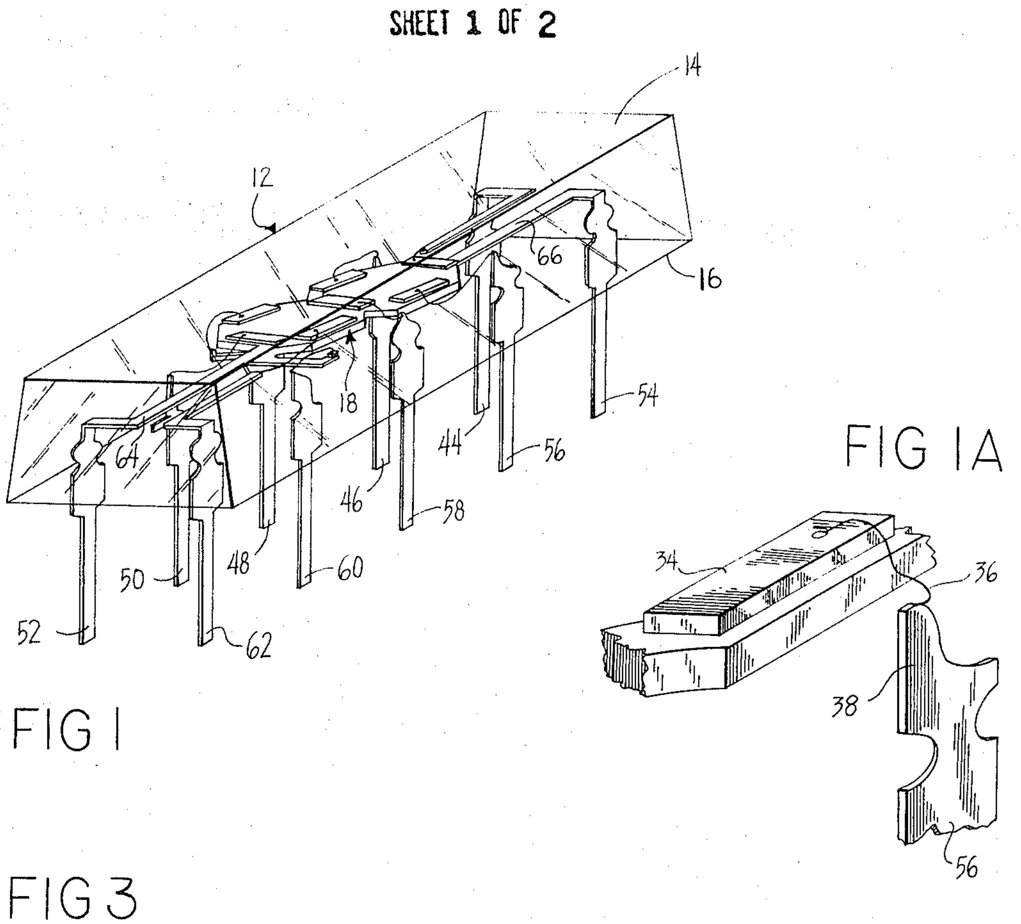
FIG. 1, FIG. 1A
FIG 3
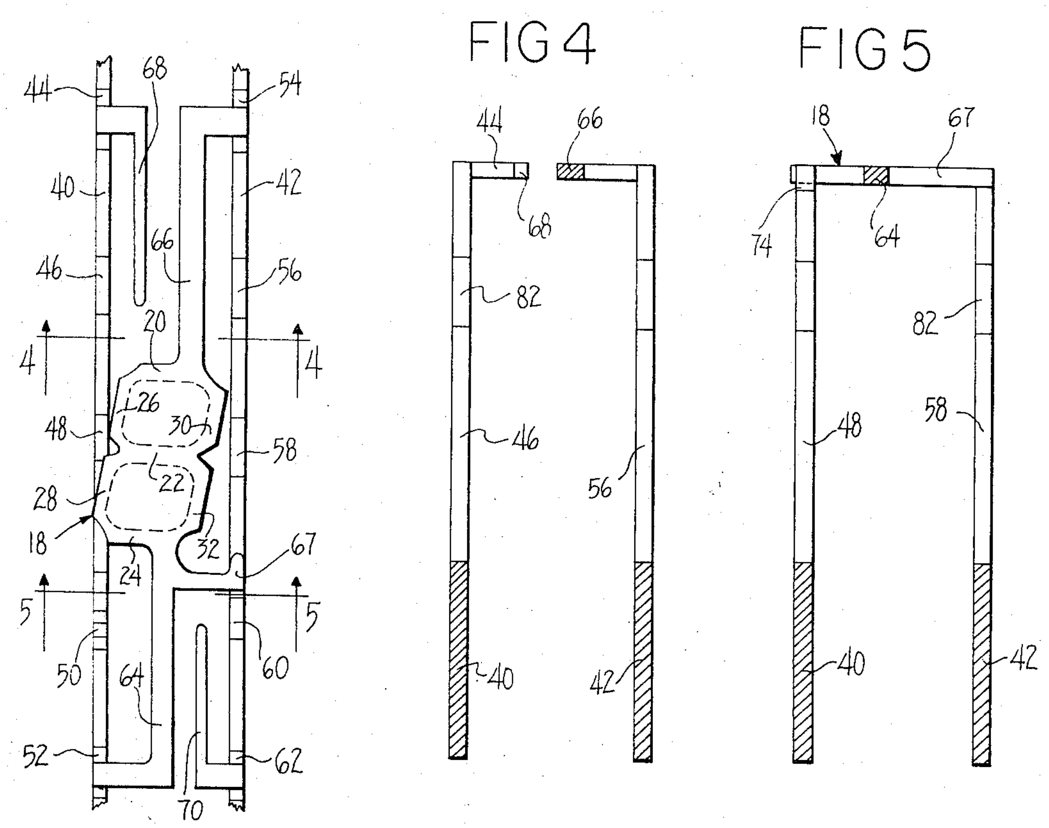
FIG. 4, FIG. 5

SOLID STATE ALPHANUMERIC INDICATOR AND LEAD FRAME

This invention relates to an improved solid state alphanumeric indicator, to an improved lead frame for constructing the indicator, and to a method for fabricating the indicator.

An alphanumeric indicator according to the present invention, as is true with known prior art devices of the same type, includes a metallic base member that has a shape corresponding to the character to be displayed by the indicator. For illustrating the invention the specific embodiment described hereinafter in detail and shown on the accompanying drawings is in the form of a figure 8 composed of seven regions in an integral assembly. To each of the regions is fastened a light emitting semi-conductor die made from suitably doped gallium arsenide phosphide or the like. Excitation of the dice in various combinations produces, in this example, numerals from 1 to 0. Although the figure 8 configuration is convenient for illustrating and describing the present invention it is to be understood that the present invention is not limited to such shape of indicator.

The conventional method of fabrication which is also employed in practicing the present invention is to provide an appropriately shape lead frame, attach the light emitting dice to the lead frame, attach conductors from the dice to appropriate leads in the lead frame, and to encapsulate in suitable transparent plastic material at least the central portion of the lead frame where the dice and attaching conductors are located. The portions of the lead frame that protrude from the plastic encapsulation material constitute terminals for affording electrical connections to external circuitry.

An object of this invention is to provide an alphanumeric indicator that has all terminal pins thereof extending from the rear face, the face opposite the front face at which is displayed the character. Achievement of this object is to be contrasted with certain known prior art structures wherein the terminal pins exited from the opposite lateral sides of the device and wherein the terminals had to be bent after final assembly for connection into circuitry.

Another object of the present invention is to provide a lead frame for an alphanumeric indicator that is so configured that the lead frame, prior to attachment of the semi-conductor dice and prior to encapsulation, can be bent into the final form in which it resides in the completed device. This object is achieved by providing an elongate lead frame in which the base member for the alphanumeric character is disposed centrally or mesially of the lead frame and wherein the terminal leads approach the base member from opposite sides. The parts of the lead frame are so configured that the two side or distal portions of the lead frame, i.e., those constituted by the terminal pins, can be bent perpendicularly with respect to the base portion so that the dice can be attached and connected and the unit can be encapsulated without further deformation or bending of the lead frame. A feature and advantage of a lead frame according to the present invention is that the aforementioned bends are effected along on two straight parallel lines so that the tooling or jigs used to effect the bends are of extremely simple form.

Still another object is to provide an alphanumeric indicator that lends itself to rapid and simple encapsulation. Achievement of this object is possible because the terminal pin leads of the lead frame protrude from one side of the device whereupon encapsulation is achieved by the simple expedient of providing a cavity having a shape corresponding to the desired shape of the completed device, suspending the assembled lead frame into the cavity with the terminal pins extending upward and filling the cavity with appropriate transparent plastic encapsulation material. This technique of encapsulation is to be contrasted with various prior art techniques wherein the terminals extend from two opposite sides of the lead frame in consequence of which the lead frame must be provided with so-called flash stops which are portions of the lead frame that prevent the egress of the encapsulation material and which must be cut or trimmed off during the completion of the device. The present invention totally eliminates one time consuming step in the manufacture of the devices.

Other objects, features, and advantages will become more apparent after referring to the following specification and accompanying drawings in which:

FIG. 1 is a perspective view of an alphanumeric indicator device constructed in accordance with the present inventions;

FIG. 1A is a fragmentary view at enlarged scale of the device of FIG. 1;

FIG. 3 is a top view of a portion of the lead frame after the lead frame is bent into its final position;

FIG. 4 is a cross sectional view taken along line 4—4 of FIG. 3;

FIG. 5 is a cross sectional view taken along line 5—5 of FIG. 3.

Figure 2:
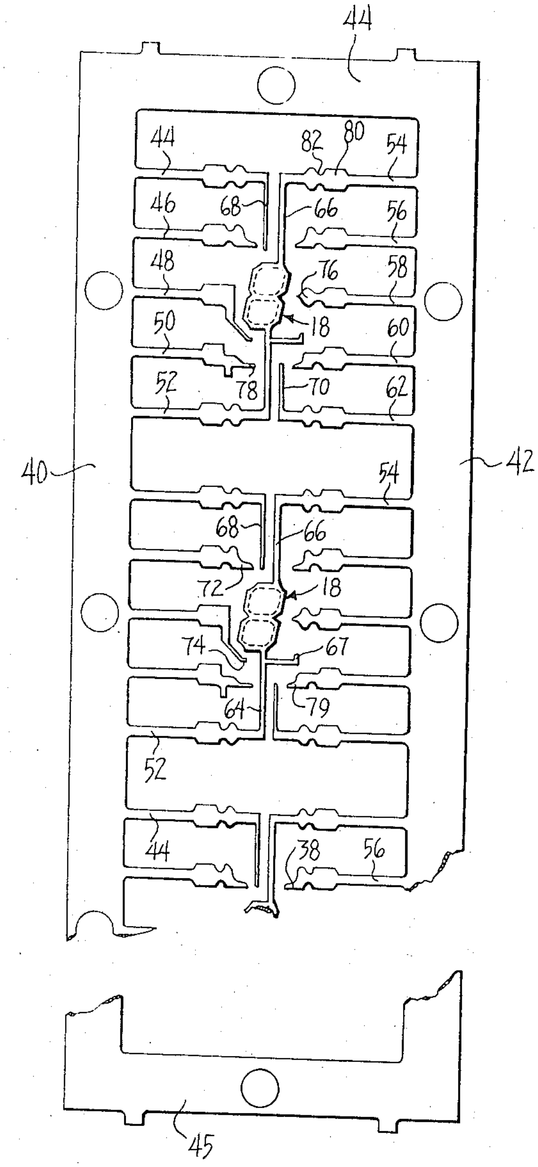
FIG. 2 is a fragmentary view at greatly enlarged scale of a lead frame of the present invention.

Referring more particularly to the drawing, reference numeral 12 indicates a body of transparent material that is used to encapsulate the alphanumeric indicator of the present invention. The material of which body 12 is formed is selected by conventional methods for its strength, its transparency, and its insulative properties. The material is typically formulated from two components and is flowable in its uncured state and rigid or solid in its cured state. The body has a planar upper or front surface 14 and a lower or rear surface 16 which is parallel with upper surface 14. Embedded within the body 12 is an alphanumeric character 18 which in the embodiment disclosed in detail herein and shown in the drawings is a figure 8.

The figure 8 configuration as can be seen in FIG. 3 is formed by seven linear elements or regions. More particularly there are three horizontal regions 20, 22 and 24, spanning the ends of which at one side are vertical regions 26 and 28 and at the other side vertical regions 30 and 32. To each of the linear regions of the base member is attached a die exemplified in FIG. 1A at 34. The die is any suitable light emitting semiconductor material which has a terminal on its lower surface that is fastened both mechanically and electrically to the base member and a terminal on the top surface to which a conductor wire 36 is connected. The opposite end of wire 36 is fastened to a terminal pin 38 which will be described in more detail hereinafter. In FIGS. 2 and 3 each of linear regions or elements is indicated by a broken line; in practice the broken lines are not present on base member 18 but merely identify the location and pattern for attachment of the light emitting dice.

The lead frame structure includes a relatively wide peripheral frame formed by parallel support bars 40 and 42 which are joined together at opposite ends by suitable means indicated at 44 and 45 which are typically members that are identical in size to the support bars. The entire lead frame is constructed of relatively thin conductive material that can be bent easily and that has sufficient strength to be self supporting during fabrication. In one lead frame design according to the present invention there are five individual sets of elements at opposite ends of which are crossbars 44 and 45.

Since each set of elements is identical only one will be described in detail. Extending inward from support bar 40 is a plurality of lead members 44, 46, 48, 50, and 52. Each of the lead members 44–52, is joined to support bar 40. The ends of lead members closest to support bars 40, 42, will be referred to herein as the distal ends and the opposite ends of the lead members will be referred to as the mesial ends thereof. Extending inwardly from support bar 42 and in alignment respectively with lead members 44–52 is a second plurality of lead members 54, 56, 58, 60, and 62. As can be seen in FIG. 2, lead members 54–62 have their distal ends joined to support bar 42 and their mesial ends spaced from base member 18.

The lead members support the parts of the device during fabrication thereof and constitute terminal pins in the completed device. For supporting the base member 18 during fabrication of the device, lead members 52 and 54, which are located at opposite lateral and longitudinal extremities of the set of elements, include longitudinally extending components 64 and 66 respectively. The longitudinally extending components are integral with both the laterally extending lead members 52 and 54 and the base member 18, thereby supporting the base member in proper position during fabrication and affording an electrical connection to the base member in the completed device. As can be seen most clearly in FIG. 3 components 64 and 66 are located in the central or mesial region and therefore are not distorted when the lead frame is bent into the position shown in FIG. 3. Also not distorted is a decimal point support 67 which extends laterally from component 64 and is integral therewith. The remaining lead members are spaced from one another and are spaced from base member 18 so that to each one can be connected the end of a conductor wire exemplified at 36 in FIG. 1A.

As can be seen in FIG. 2, the mesial ends of the lead members are configured so as to achieve two desiderata. First, is desirable that the terminal pins constituted by the distal ends of the lead members be uniformly spaced from another: for example, the terminal pins are on 0.100 inch centers in one device designed according to the present invention. Second, it is desirable that the mesial ends of the lead members reside as closely as practicable to base member 18 so that the length of the conductor wires between the dice on the base member and the respective lead members is minimized. More particularly lead member 44 includes a central longitudinally extending segment 68 which resides in the mesial or central region of the lead frame and lead member 62 includes a similar longitudinally extending segment 70. As can be seen from the drawings segments 68 and 70 extend toward base member 18 but terminate in spaced relation thereto so as to afford convenient connection with dice supported respectively on regions 20 and 24 of the base member. Lead members 46 and 56 have centrally or mesially disposed terminations, one of which is indicated by reference numeral 72, that are on the longitudinal side of the lead members closest to base member 18. Lead member 48 terminates at the mesial extremity thereof in a longitudinally offset portion 74 which is spaced from but adjacent to base member 18. Lead member 58 extends in a symmetrical tip 76 that is in longitudinal alignment with the center of the base member. Finally lead members 50 and 60 terminate respectively at points 78 and 79 that are in spaced relation to the lower longitudinal extremity of base member 18. It is important to note that tips 72, 74 and 78 are located on a straight line that is parallel to the longitudinal axis of the device and to components 64 and 66. Similarly it will be noted that the mesial extremities of lead members 56, 58 and 60 are similarly located on a straight line on the side of the base member opposite the previously mentioned line and parallel to the longitudinal axis of the device. It will be similarly noted that all of the mesial extremities of the lead frames in the sets of elements on a given lead frame structure lie on a same line so that the lead frame in the flat condition shown in FIG. 2 can be bent into the position shown by FIGS. 3–5 by a simple jig that has edges corresponding to the location of the mesial extremities of the lead members. Thus when the lead frame is bent into the condition shown in FIGS. 4 and 5 the mesial extremities of the lead members will be in the appropriate lateral position and will be at the approximately the same vertical level as the base member 18, whereby the length of conductor wire 36 will be minimized. It can also be appreciated from FIG. 3, that when the lead frame is bent into the operative position, longitudinally extending components 64, 66, 68 and 70 lie in the same plane as does base member 18.

A final detail of construction of the lead frame structure is the presence adjacent the mesial end of each lead member of an enlargement 80 in which a notch 82 is formed. The rear surface 16 of body 12 is coextensive with enlargement 80 to strengthen the terminals at the point of exit from body 12. The notch 82 is filed with plastic during encapsulation to eliminate movement of the terminal pins along their axes.

The method of employing the lead frame of this invention in fabricating an alphanumeric indicator is performed by first providing the lead frame of FIG. 2 wherein the mesial ends of lead members 46, 48 and 50 are on one longitudinally extending line and the mesial ends of lead members 56, 58 and 60 are on another line that is parallelly spaced from the first mentioned line. By means of a suitable jig the lead frame is bent along the two lines described above and such bending procedure is extremely efficient since the bends only occur at the mesial regions of the transverse portions of lead members 44, 52, 54 and 62. With the lead frame in the position described above and shown in FIGS. 3–5, the individual light emitting semi-conductor dice are attached by conventional welding or brazing techniques to the elements of base member 18 and to the decimal point extension thereof. Next as exemplified in FIG. 1A conductor wires are connected as by welding or brazing from each individual die to the mesial tip end of the appropriate lead member. Next a mold is provided that has, in the example described herein, five uniformly spaced apart cavities (one for each set of lead frame elements) that are shaped according to the desired shape of body 12 shown in FIG. 1. The cavity has side walls that converge toward the bottom surface of cavity to facilitate removal of the completed device. Next the assembled lead frame is inverted and positioned over the mold so that each set of elements resides within a respective mold cavity. The mold can be provided with indexing pins at opposite ends thereof to position the lead frame by entering the holes centrally of support bars 44 and 45. Because of the presence of support bars 40, 42, 44 and 45 the structure is relatively rigid and can be fixed with respect to the mold so that the base members 18 and the attached light emitting dice can be spaced intermediate the upper and lower extremities of the cavities. Suitable encapsulating resin is then introduced to each mold cavity to a level approximating the midpoint of enlargement 80 on the lead members and the resin is then caused to set or harden, such as by placing the entire structure in a suitable elevated temperature environment for a time appropriate for the particular encapsulating material selected. Finally when the encapsulating material has cured or hardened support bar 40, 42, 44, and 45 are trimmed off by cutting each of the lead members at the distal end thereof where it attaches to the support bars and five completed alphanumeric devices are the result. Quite obviously the number five is employed herein only by way of example since, although such number has been found convenient for handling, it will be obvious that virtually any practicable number of elements can be provided on a given lead frame structure.

As can be appreciated from the foregoing description and from FIG. 1 the devices produced according to the present invention can be placed adjacent one another in a finished device such as a display panel for a calculating machine so that the alphanumeric characters could be placed close to one another both in the vertical and horizontal direction. Accordingly the device produced by this invention lends itself to attractive and highly readable dispay panels because the device has no significant lateral extensions and since the electrical connections to the alphanumeric indicator are effected through the rear of the device.

Thus will be seen that the present invention provides an improved alphanumeric indicator and an improved method for fabricating such indicator. The device and the method are made possible by employing an improved lead frame configuration.

The invention is also employed to advantage when the seven light emitting components are formed on a single monolithic chip as well as when they are formed as individual chips.

Although one embodiment of the present invention has been shown and described it will be obvious that other adaptations and modifications can be made without departing from the true spirit and scope of the invention.

What is claimed is:

1. An alphanumeric character indicator comprising a rigid transparent body having upper and lower parallel spaced apart surfaces, an electrically conductive base member embedded in the body intermediate said surfaces and parallel thereto, said base member having a shape corresponding to said alphanumeric character and serving as a mechanical support and a common electrical connector, a plurality of light emitting dice mounted on said base member so that exitation of said dice produces a pattern corresponding to said character, each of said dice having first and second electrical terminals, said first terminals being electrically connected to said base member, said base member having a pair of conductive extensions extending therefrom and coplanar therewith, said extensions at a site remote from said base member each having a laterally extending portion, said laterally extending portions being oppositely directed from the center of said base member and at their respective lateral extremities having elongate elements that extend normal to said lower surface and project outwardly thereof to define terminal pins for establishing electrical connection to said base member and the first terminals of said dice, a first plurality of terminal pins in alignment with one said elongate element and a second plurality of terminal pins in alignment with the other said elongate element and arranged in a row parallel to said first plurality of terminal pins, said first and second plurality of terminal pins lying respectively in two parallel planes normal to said base member, said terminal pins having inner ends embedded in said body adjacent said base member, the inner ends of less than all of said terminal pins each having a laterally extending portion substantially coplanar with the plane of said base member, and conductor means embedded in said body and connecting said second electrical terminals to the inner ends of different ones of said terminal pins.

2. The apparatus of claim 1 wherein each of said terminals pins is provided with an enlarged portion along the length thereof within and adjacent said lower body surface to strengthen said pin at the point of exit therefrom.

3. The apparatus of claim 2 wherein at least some of said enlarged portions are notched to prevent axial movement of the associated terminal pin within said body.

* * * * *